(12) United States Patent
Umeda et al.

(10) Patent No.: US 9,831,416 B2
(45) Date of Patent: Nov. 28, 2017

(54) PIEZOELECTRIC MEMBER THAT ACHIEVES HIGH SOUND SPEED, ACOUSTIC WAVE APPARATUS, AND PIEZOELECTRIC MEMBER MANUFACTURING METHOD

(71) Applicants: Murata Manufacturing Co., Ltd., Nagaokakyo-shi, Kyoto-fu (JP); NATIONAL INSTITUTE OF ADVANCED INDUSTRIAL SCIENCE AND TECHNOLOGY, Chiyoda-ku, Tokyo (JP)

(72) Inventors: Keiichi Umeda, Nagaokakyo (JP); Atsushi Honda, Nagaokakyo (JP); Atsushi Tanaka, Nagaokakyo (JP); Masashi Omura, Nagaokakyo (JP); Morito Akiyama, Tosu (JP)

(73) Assignees: MURATA MANUFACTURING CO., LTD., Kyoto (JP); NATIONAL INSTITUTE OF ADVANCED INDUSTRIAL SCIENCE, Tokyo (JP)

( * ) Notice: Subject to any disclaimer, the term of this patent is extended or adjusted under 35 U.S.C. 154(b) by 191 days.

(21) Appl. No.: 14/716,974

(22) Filed: May 20, 2015

(65) Prior Publication Data
US 2015/0287905 A1 Oct. 8, 2015

Related U.S. Application Data

(63) Continuation of application No. PCT/JP2013/080269, filed on Nov. 8, 2013.

(30) Foreign Application Priority Data

Dec. 5, 2012 (JP) ................................. 2012-266272
Mar. 22, 2013 (JP) ................................. 2013-060331

(51) Int. Cl.
*H01L 41/187* (2006.01)
*H01L 41/18* (2006.01)
(Continued)

(52) U.S. Cl.
CPC .......... *H01L 41/18* (2013.01); *C23C 14/0617* (2013.01); *C23C 14/0641* (2013.01);
(Continued)

(58) Field of Classification Search
CPC ........................... H01L 41/083; H01L 41/047
See application file for complete search history.

(56) References Cited

U.S. PATENT DOCUMENTS 5,523,589 A  6/1996 Edmond et al.
5,766,783 A * 6/1998 Utsumi ............... C23C 14/0641
428/336

(Continued)

FOREIGN PATENT DOCUMENTS

EP          730044 A2 *  9/1996
JP         07-315998 A   12/1995
(Continued)

OTHER PUBLICATIONS

Official Communication issued in International Patent Application No. PCT/JP2013/080269, dated Dec. 17, 2013.

*Primary Examiner* — J. San Martin
(74) *Attorney, Agent, or Firm* — Keating & Bennett, LLP (57) ABSTRACT

A piezoelectric member that achieves a high sound speed includes a silicon-containing substrate and a piezoelectric layer. The piezoelectric layer is disposed on the silicon-containing substrate. At least a surface layer of the piezoelectric layer on a side opposite to the silicon-containing substrate is made of $B_xAl_{1-x}N$ ($0<x\leq 0.2$).

16 Claims, 10 Drawing Sheets

(51) Int. Cl.
  *C23C 14/34* (2006.01)
  *C30B 23/02* (2006.01)
  *C30B 29/40* (2006.01)
  *C23C 14/06* (2006.01)
  *H01L 41/316* (2013.01)
  *H03H 9/02* (2006.01)

(52) U.S. Cl.
  CPC ............ *C23C 14/34* (2013.01); *C30B 23/025* (2013.01); *C30B 29/403* (2013.01); *H01L 41/187* (2013.01); *H01L 41/316* (2013.01); *H03H 9/02015* (2013.01); *H03H 9/02574* (2013.01)

(56) References Cited

U.S. PATENT DOCUMENTS

| | | |
|---|---|---|
| 2002/0047497 A1 | 4/2002 | Higuchi et al. |
| 2008/0197750 A1* | 8/2008 | Katardjiev .......... C23C 14/0617 310/311 |
| 2011/0298564 A1 | 12/2011 | Iwashita et al. |
| 2012/0104900 A1* | 5/2012 | Nishihara .............. H03H 9/584 310/326 |
| 2015/0069882 A1* | 3/2015 | Umeda ................ H03H 9/02574 310/313 B |
| 2015/0263697 A1* | 9/2015 | Zhang ................ H03H 9/02102 310/346 |
| 2015/0280100 A1* | 10/2015 | Burak ................. H01L 41/0477 310/321 |
| 2016/0149074 A1* | 5/2016 | Atanackovic ......... H01L 33/007 257/13 |

FOREIGN PATENT DOCUMENTS

| | | |
|---|---|---|
| JP | 08-008182 A | 1/1996 |
| JP | 08-239752 A | 9/1996 |
| JP | 08-310900 A | 11/1996 |
| JP | 10-506234 A | 6/1998 |
| JP | 2002-176331 A | 6/2002 |
| JP | 2005-265423 A | 9/2005 |
| JP | 2010-087578 A | 4/2010 |
| JP | 2010-123818 A | 6/2010 |
| WO | 2010/095640 A1 | 8/2010 |

* cited by examiner

PIEZOELECTRIC MEMBER THAT ACHIEVES HIGH SOUND SPEED, ACOUSTIC WAVE APPARATUS, AND PIEZOELECTRIC MEMBER MANUFACTURING METHOD

BACKGROUND OF THE INVENTION

1. Field of the Invention

The present invention relates to a piezoelectric member, an acoustic wave apparatus, and a piezoelectric member manufacturing method.

2. Description of the Related Art

These days, an acoustic wave apparatus is widely used as, for example, a filter of a mobile communication terminal. It is desired for the acoustic wave apparatus to increase the sound speed of the acoustic wave in order to achieve downsizing, etc. Japanese Patent Laid-Open No. 8-310900 discloses a member with a surface layer made of AlN, for example. Since AlN has a high Young's modulus, using the member disclosed in Japanese Patent Laid-Open No. 8-310900 can increase the sound speed of the acoustic wave apparatus.

However, there is a case where the member disclosed in Japanese Patent Laid-Open No. 8-310900 cannot meet the demand of further increasing the sound speed of the acoustic wave apparatus. That is, although the sound speed of the acoustic wave can be increased to some extent because the surface layer has a high Young's modulus due to being formed of AlN, the member cannot achieve still higher sound speeds sufficiently.

SUMMARY OF THE INVENTION

Preferred embodiments of the present invention provide a piezoelectric member that achieves a high sound speed. A piezoelectric member according to a preferred embodiment of the present invention includes a silicon-containing substrate and a piezoelectric layer. The piezoelectric layer is disposed on the silicon-containing substrate. At least a surface layer of the piezoelectric layer on a side opposite to the silicon-containing substrate is made of $B_xAl_{1-x}N$ ($0 < x \leq 0.2$).

In a specific aspect of various preferred embodiments of piezoelectric members according to the present invention, $0.03 \leq x \leq 0.18$.

In another specific aspect of various preferred embodiments of piezoelectric members of the present invention, the portion made of $B_xAl_{1-x}N$ of the piezoelectric layer contains a wurtzite-type crystal of $B_xAl_{1-x}N$.

In yet another specific aspect of various preferred embodiments of piezoelectric members according to the present invention, the portion made of $B_xAl_{1-x}N$ of the piezoelectric layer is C-axis oriented so that the (0001) plane is parallel to the surface of the silicon-containing substrate.

In yet another specific aspect of various preferred embodiments of piezoelectric members according to the present invention, a piezoelectric member further includes an aluminum nitride layer disposed between the silicon-containing substrate and the piezoelectric layer.

In yet another specific aspect of various preferred embodiments of piezoelectric members according to the present invention, the thickness of the aluminum nitride layer is about 10 nm or more.

In yet another specific aspect of various preferred embodiments of piezoelectric members according to the present invention, the piezoelectric member further includes a Mo metal layer disposed between the aluminum nitride layer and the piezoelectric layer.

In yet another specific aspect of various preferred embodiments of piezoelectric members according to the present invention, the piezoelectric member further includes another aluminum nitride layer disposed between the Mo metal layer and the piezoelectric layer.

In yet another specific aspect of various preferred embodiments of piezoelectric members according to the present invention, the aluminum nitride layer contains a wurtzite-type crystal of aluminum nitride.

An acoustic wave apparatus according to another preferred embodiment of the present invention includes the piezoelectric member according to other preferred embodiments of the present invention.

A piezoelectric member manufacturing method according to yet another preferred embodiment of the present invention relates to a method for manufacturing the piezoelectric member according to other preferred embodiments of the present invention. In the piezoelectric member manufacturing method according to a preferred embodiment of the present invention, the piezoelectric layer is formed by a sputtering method.

Various preferred embodiments of the present invention provide a piezoelectric member capable of achieving a high sound speed.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinbelow, examples of preferred embodiments of the present invention are described. However, the following preferred embodiments are only examples. The present invention is not limited to the following examples of preferred embodiments.

In the drawings referred to in the description of examples of preferred embodiments of the present invention, etc., components having the same or substantially the same function are referred to with the same reference characters. The drawings referred to description of examples of preferred embodiments of the present invention, etc. are schematically described ones. The shapes, arrangements, ratios of dimensions, etc. of elements and objects depicted in the drawings may be different from those of the actual objects. The shapes, arrangements, ratios of dimensions, etc. of elements and objects may be different also among drawings.

First Preferred Embodiment

Figure 1:
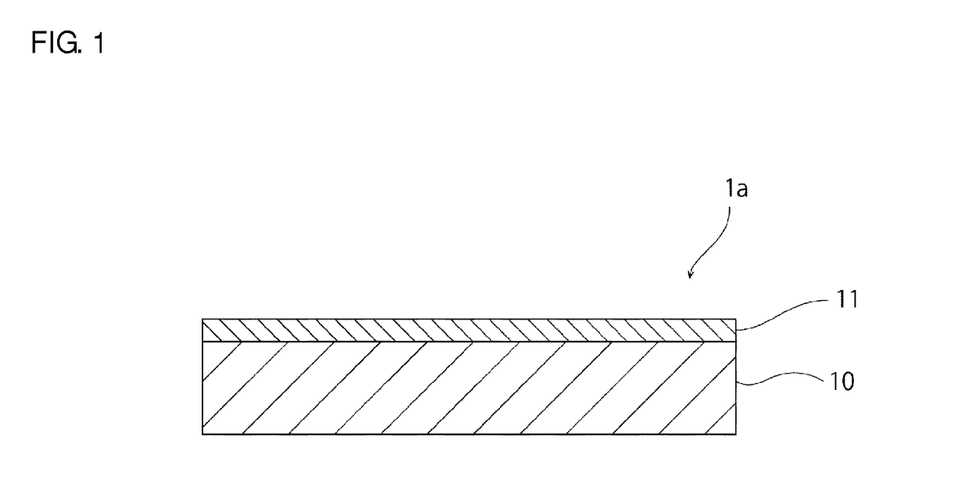
FIG. 1 is a schematic cross-sectional view of a piezoelectric member according to a first preferred embodiment of the present invention.

FIG. 1 is a schematic cross-sectional view of a piezoelectric member according to a first preferred embodiment of the present invention. As shown in FIG. 1, a piezoelectric member 1a includes a silicon-containing substrate 10 and a piezoelectric layer 11.

The silicon-containing substrate 10 is a substrate containing silicon. The silicon-containing substrate 10 preferably is made of a silicon substrate or a glass substrate containing silicon, for example. The silicon-containing substrate 10 is less expensive than sapphire single crystal substrates and the like. Thus, the costs of the piezoelectric member 1a preferably is reduced by using the silicon-containing substrate 10. Furthermore, the linear expansion coefficient difference between silicon and aluminum nitride is small; thus, when an aluminum nitride film is formed on a silicon substrate, warpage is less likely to occur and peeling of the deposited aluminum nitride film is less likely to occur. Furthermore, the silicon substrate is good in processability, and is therefore easy to make very thin and small.

The piezoelectric layer 11 is provided on the silicon-containing substrate 10. Of the piezoelectric layer 11, at least a surface layer on the side opposite to the silicon-containing substrate 10 is made of $B_xAl_{1-x}N$ ($0<x\leq0.2$). Although a configuration in which only a surface layer on the side opposite to the silicon-containing substrate 10 of the piezoelectric layer 11 preferably is made of $B_xAl_{1-x}N$ and the other portions preferably are made of a piezoelectric material other than $B_xAl_{1-x}N$ is possible, an example in which the entire piezoelectric layer 11 is preferably made of $B_xAl_{1-x}N$ is described in the present preferred embodiment.

The portion made of $B_xAl_{1-x}N$ of the piezoelectric layer 11 preferably contains a wurtzite-type crystal of $B_xAl_{1-x}N$.

The portion made of $B_xAl_{1-x}N$ of the piezoelectric layer 11 is preferably C-axis oriented so that the (0001) plane is parallel to the surface of the silicon-containing substrate 10. In the case where the portion made of $B_xAl_{1-x}N$ of the piezoelectric layer 11 is C-axis oriented, when comb electrodes are provided on the portion made of $B_xAl_{1-x}N$, an elastic surface wave resonator utilizing a Rayleigh wave or a Sezawa wave is able to be obtained, and when electrodes are provided on the upper and lower sides of the portion made of $B_xAl_{1-x}N$, a bulk wave oscillator or a plate wave (Lamb wave) oscillator utilizing bending vibration, contour vibration, thickness longitudinal vibration, etc. is able to be obtained.

Figure 2:
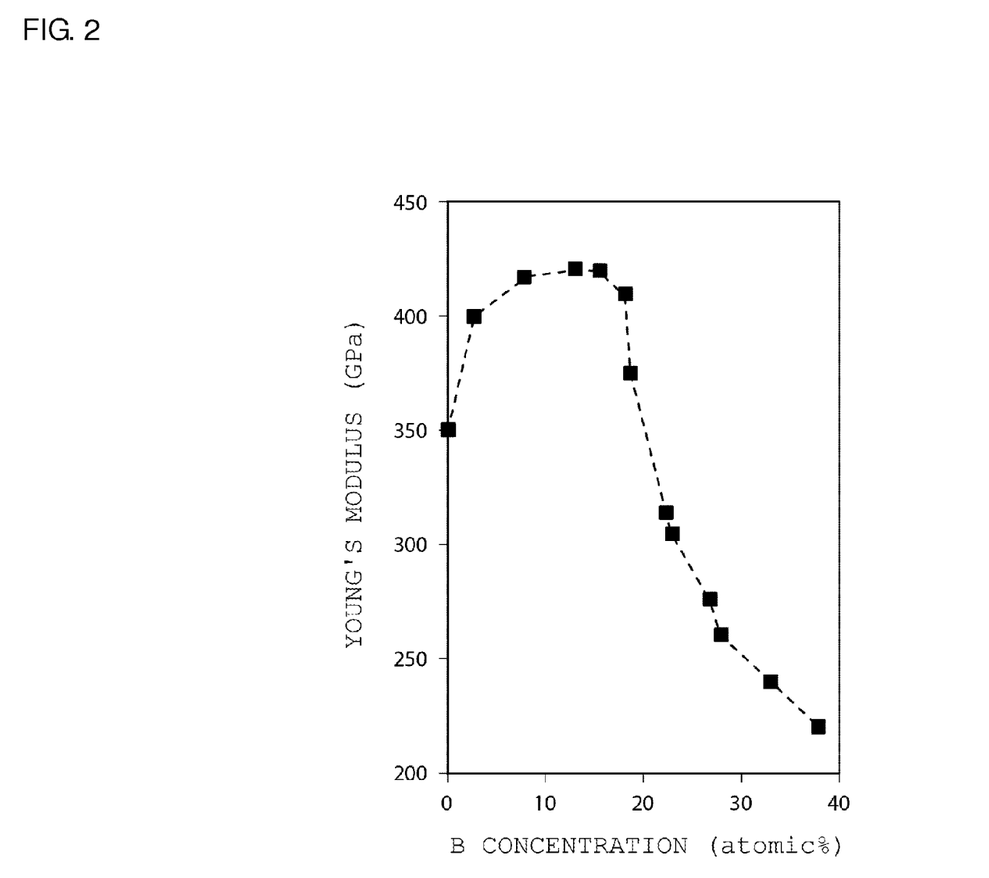
FIG. 2 is a graph showing the relationship between the concentration of boron in a piezoelectric layer and the Young's modulus of the piezoelectric layer.
Figure 3:
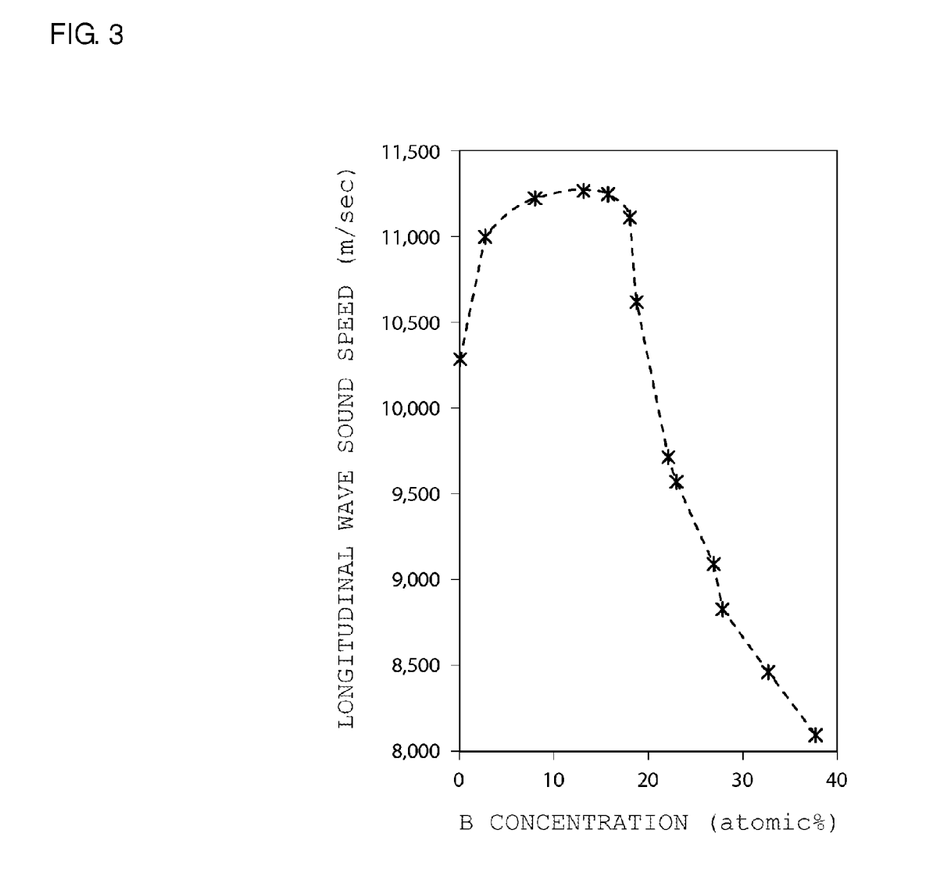
FIG. 3 is a graph showing the relationship between the concentration of boron in the piezoelectric layer and the sound speed of the longitudinal wave.

FIG. 2 is a graph showing the relationship between the concentration of boron (B) in the piezoelectric layer 11 and the Young's modulus of the piezoelectric layer 11. FIG. 3 is a graph showing the relationship between the concentration of boron (B) in the piezoelectric layer 11 and the sound speed of the longitudinal wave.

From the graph shown in FIG. 2, it is seen that even when boron is added to the layer made of AlN, there is a case where the Young's modulus cannot be made large depending on the amount of added boron. From the graph shown in FIG. 3, it is seen that even when boron is added to the layer made of AlN, there is a case where the sound speed cannot be made high depending on the amount of added boron. The results shown in FIG. 2 and FIG. 3 show that, when the concentration of boron in the piezoelectric layer 11 is about 20 atomic % or less, the Young's modulus preferably is made higher than when boron is not added, and that consequently the sound speed preferably is made higher than when the piezoelectric layer is formed of AlN. That is, it was discovered that a high Young's modulus and a high sound speed are achieved by setting x in $B_xAl_{1-x}N$ to larger than 0 and about 0.2 or less, for example.

The results shown in FIG. 2 and FIG. 3 show also that, by setting the concentration of boron in the piezoelectric layer 11 to about 3 atomic % or more and about 18 atomic % or less, a Young's modulus higher than the Young's modulus of a sapphire substrate (i.e., about 400 GPa) and a sound speed higher than the sound speed of the longitudinal wave of a sapphire substrate (i.e., about 11,000 m/sec) are achieved. That is, it was discovered that a Young's modulus higher than the Young's modulus of a sapphire substrate (i.e., about 400 GPa) and a sound speed higher than the sound speed of the longitudinal wave of a sapphire substrate (i.e., about 11,000 m/sec) are achieved by setting x in $B_xAl_{1-x}N$ to about 0.03 or more and about 0.18 or less, for example.

The thickness of the piezoelectric layer 11 is preferably about 50 nm to about 5000 nm, for example. When only a surface layer of the piezoelectric layer 11 is made of $B_xAl_{1-x}N$, the thickness of the surface layer made of $B_xAl_{1-x}N$ of the piezoelectric layer 11 is preferably about 50 nm to about 5000 nm, for example.

Hereinbelow, other examples of preferred embodiments of the present invention are described. In the following description, components having a function the same or substantially the same as the first preferred embodiment described above are referred to with the common reference characters, and a description is omitted.

Second Preferred Embodiment

Figure 4:
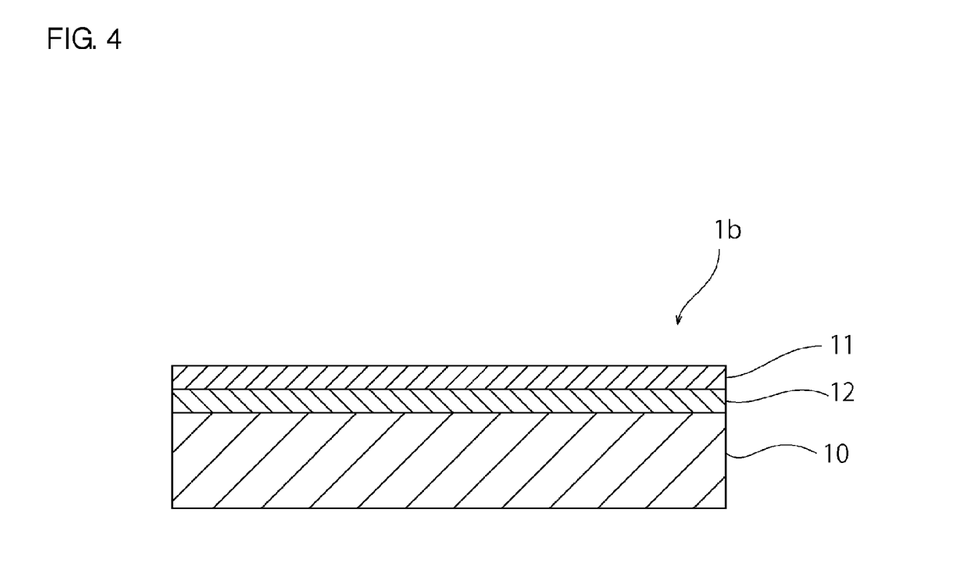
FIG. 4 is a schematic cross-sectional view of a piezoelectric member according to a second preferred embodiment of the present invention.

FIG. 4 is a schematic cross-sectional view of a piezoelectric member 1b according to a second preferred embodiment of the present invention. As shown in FIG. 4, in the piezoelectric member 1b according to the second preferred embodiment, an aluminum nitride layer 12 made of aluminum nitride is disposed between the silicon-containing substrate 10 and the piezoelectric layer 11. The aluminum nitride layer 12 preferably contains a wurtzite-type crystal of aluminum nitride.

Figure 5:
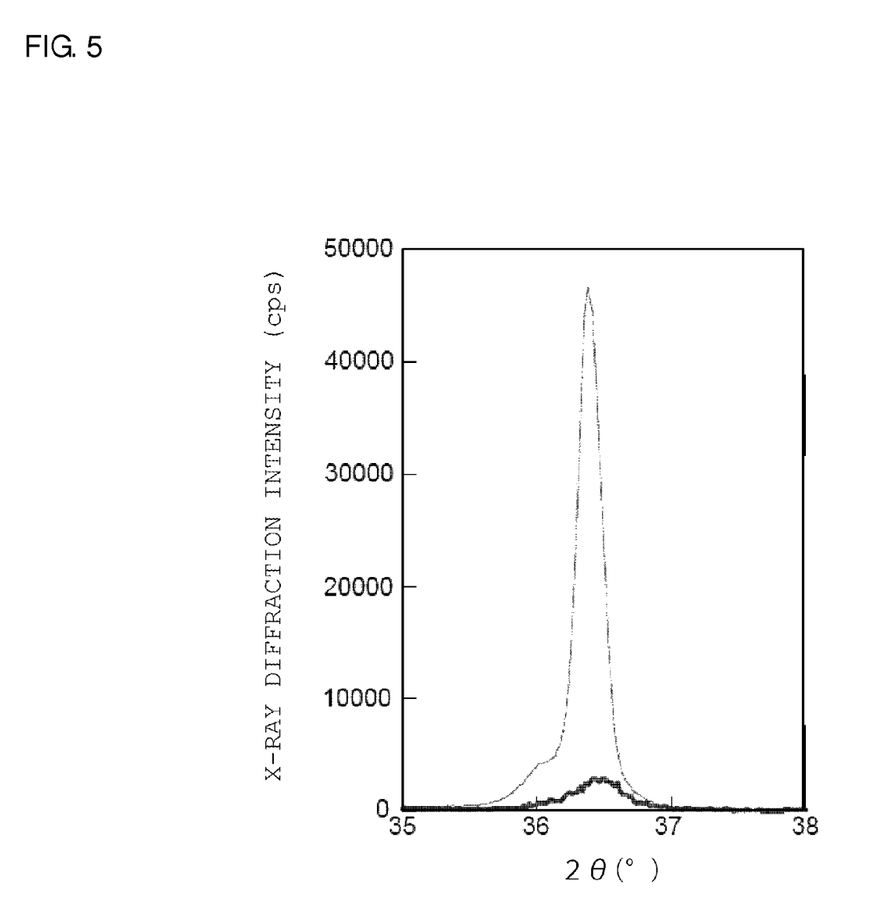
FIG. 5 shows X-ray diffraction data of a piezoelectric layer in the second preferred embodiment of the present invention.

Thus, by providing the aluminum nitride layer 12 between the silicon-containing substrate 10 and the piezoelectric layer 11, good crystallinity of the piezoelectric layer 11 is obtained as shown in FIG. 5. In particular, good crystallinity of the piezoelectric layer 11 is obtained even when the piezoelectric layer 11 is formed by a sputtering method in low temperature conditions of, for example, less than about 500° C., further about 400° C. or less, and particularly about 300° C. or less. Therefore, good piezoelectricity is achieved. Furthermore, since the piezoelectric layer 11 having good piezoelectricity is able to be formed at low temperature, heat resistance required for the silicon-containing substrate 10 is low. Thus, the selection flexibility of the silicon-containing substrate 10 is increased, and a glass substrate and the like is able to be used.

The following reasons may be given as the reasons why the crystallinity of the piezoelectric layer 11 is able to be enhanced by providing the aluminum nitride layer 12. Since $B_xAl_{1-x}N$ is lower in self orientation than AlN, a larger activation energy is needed in order to enhance the orientation of $B_xAl_{1-x}N$. Thus, in a structure in which a piezoelectric layer made of $B_xAl_{1-x}N$ is provided directly on the silicon-containing substrate 10, when a sufficient activation energy is not given, the crystallinity of the resulting $B_xAl_{1-x}N$ layer may be low. On the other hand, since AlN is high in self orientation, even when the aluminum nitride layer 12 is provided directly on the silicon-containing substrate 10, the aluminum nitride layer 12 having good crystallinity is obtained. When the piezoelectric layer 11 made of $B_xAl_{1-x}N$ is provided on the aluminum nitride layer 12 having good crystallinity, the piezoelectric layer 11 epitaxially grows easily by taking over the orientation of the aluminum nitride layer 12. As a result, energetically stable atomic arrangement is distinct in the piezoelectric layer 11, and the piezoelectric layer 11 having good crystallinity and high piezoelectricity is obtained.

Figure 6:
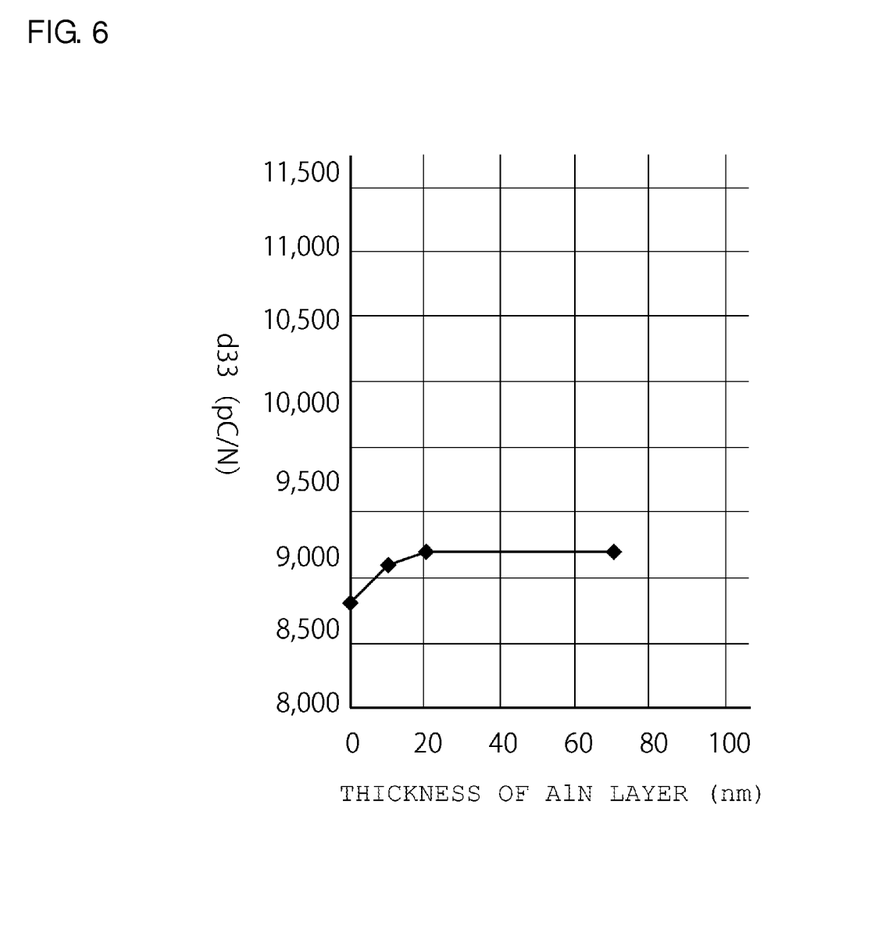
FIG. 6 is a graph showing the relationship between the thickness of an AlN layer and the piezoelectric constant ($d_{33}$) in the second preferred embodiment of the present invention.

As shown in FIG. 6, by providing the aluminum nitride layer 12, the crystallinity of the piezoelectric layer 11 is improved regardless of the thickness of the aluminum nitride layer 12, and consequently piezoelectricity is increased. From the viewpoint of achieving better piezoelectricity, the thickness of the aluminum nitride layer 12 is preferably about 10 nm or more, and more preferably about 20 nm or more, for example. The thickness of the aluminum nitride layer 12 is preferably about 1000 nm or less, for example, in view of the productivity of the aluminum nitride layer 12.

FIG. 5 and FIG. 6 show data in the case where the aluminum nitride layer 12 and the piezoelectric layer 11 are provided by a sputtering method, with the temperature of the silicon-containing substrate 10 set to about 250° C., for example.

Third Preferred Embodiment

Figure 7:
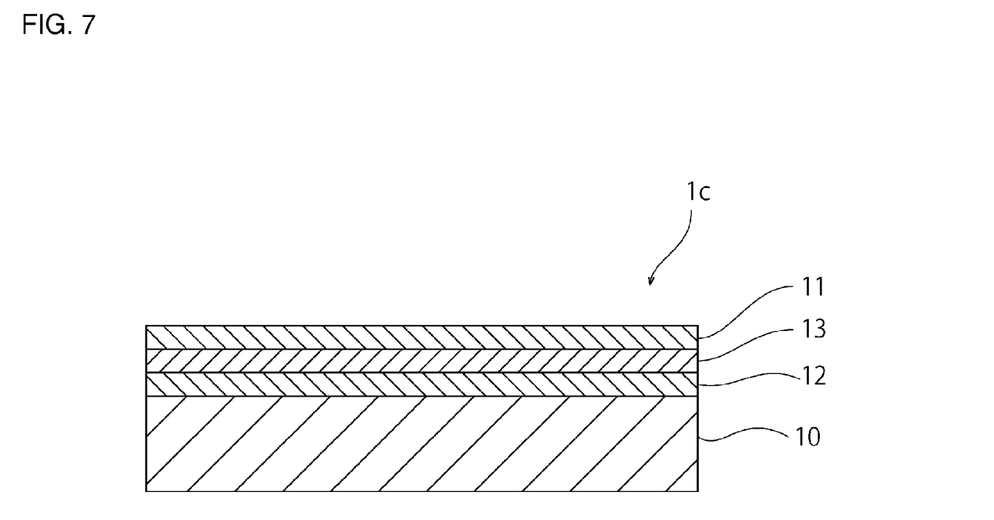
FIG. 7 is a schematic cross-sectional view of a piezoelectric member according to a third preferred embodiment of the present invention.

FIG. 7 is a schematic cross-sectional view of a piezoelectric member 1c according to a third preferred embodiment of the present invention. In the piezoelectric member 1c, a Mo (molybdenum) metal layer 13 is provided between the aluminum nitride layer 12 and the piezoelectric layer 11. The Mo metal layer 13 has electrical conductivity. Therefore, the Mo metal layer 13 can be used as, for example, an electrode. Thus, the thickness of the Mo metal layer 13 preferably is selected as appropriate in accordance with the electrical conductivity, etc. required for the Mo metal layer 13. The thickness of the Mo metal layer 13 preferably is set to about 10 nm to about 500 nm, for example.

To form a bulk wave oscillator or a Lamb wave oscillator, it is necessary to form electrodes on the upper and lower sides of the piezoelectric layer 11. In particular, the selection of the electrode layer under the piezoelectric layer 11 is important because this electrode layer greatly influences the crystal structure of the overlying piezoelectric layer 11. Since Mo has a linear expansion coefficient close to those of Si and AlN, disposing the Mo metal layer 13 suppresses the occurrence of warpage due to heat, and suppresses peeling of the thin film and property fluctuation of the device. Furthermore, the Mo metal layer 13 has little variation in Young's modulus with temperature. Thus, when the Mo metal layer 13 is used for a resonator, the frequency-temperature characteristics of the resonator are good. Also a W (tungsten) metal layer is able to be used similarly.

Figure 8:
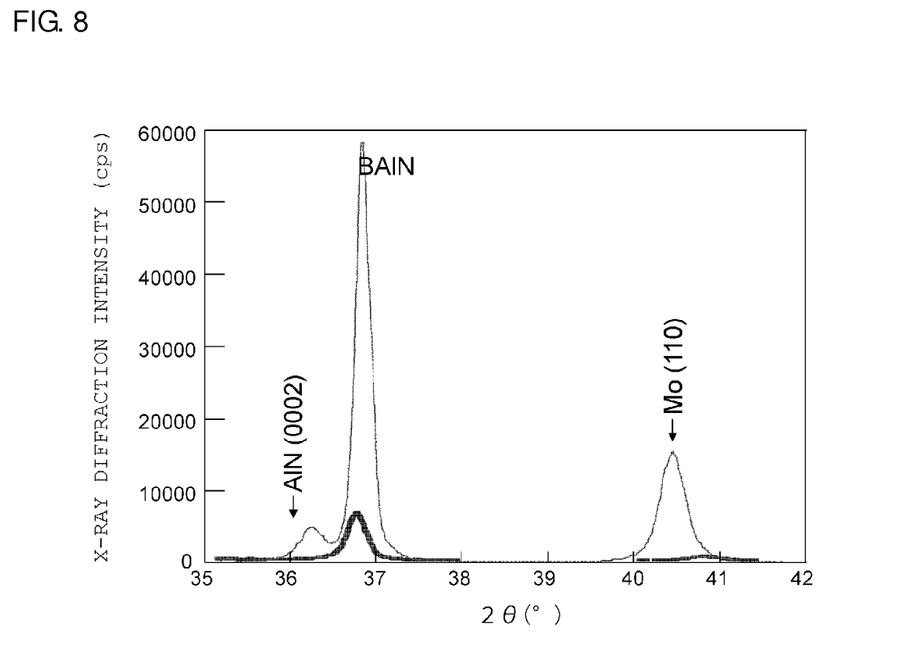
FIG. 8 shows X-ray diffraction data of a piezoelectric layer in the third preferred embodiment of the present invention.

By providing the aluminum nitride layer 12 on the silicon-containing substrate 10 and providing the Mo metal layer 13 and the piezoelectric layer 11 on the aluminum nitride layer 12 like in the present preferred embodiment, the crystallinity of both of the Mo metal layer 13 and the piezoelectric layer 11 is improved as shown in FIG. 8. In particular, the crystallinity of the Mo metal layer 13 and the piezoelectric layer 11 when the Mo metal layer 13 and the piezoelectric layer 11 are formed by a sputtering method in low temperature conditions of, for example, less than about 500° C., further about 400° C. or less, and particularly about 300° C. or less is improved. Therefore, good piezoelectricity is achieved, and the selection flexibility of the silicon-containing substrate 10 is increased.

FIG. 8 shows data in the case where the aluminum nitride layer 12, the Mo metal layer 13, and the piezoelectric layer 11 are provided by a sputtering method, with the temperature of the silicon-containing substrate 10 set to about 250° C., for example.

Fourth Preferred Embodiment

Figure 9:
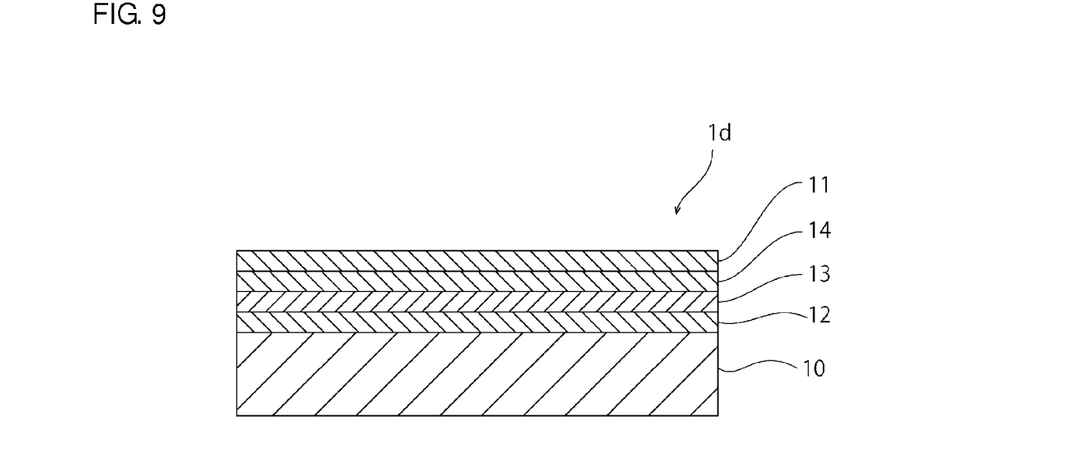
FIG. 9 is a schematic cross-sectional view of a piezoelectric member according to a fourth preferred embodiment of the present invention.

FIG. 9 is a schematic cross-sectional view of a piezoelectric member 1d according to a fourth preferred embodiment of the present invention. In the piezoelectric member 1d, an AlN layer 14 made of aluminum nitride is further provided between the Mo metal layer 13 and the piezoelectric layer 11. The AlN layer 14 preferably contains a wurtzite-type crystal of aluminum nitride.

By providing the AlN layer 14 having good crystallinity between the Mo metal layer 13 and the piezoelectric layer 11, the crystallinity of the piezoelectric layer 11 is further improved, and piezoelectricity is therefore further improved.

Fifth Preferred Embodiment

Figure 10:
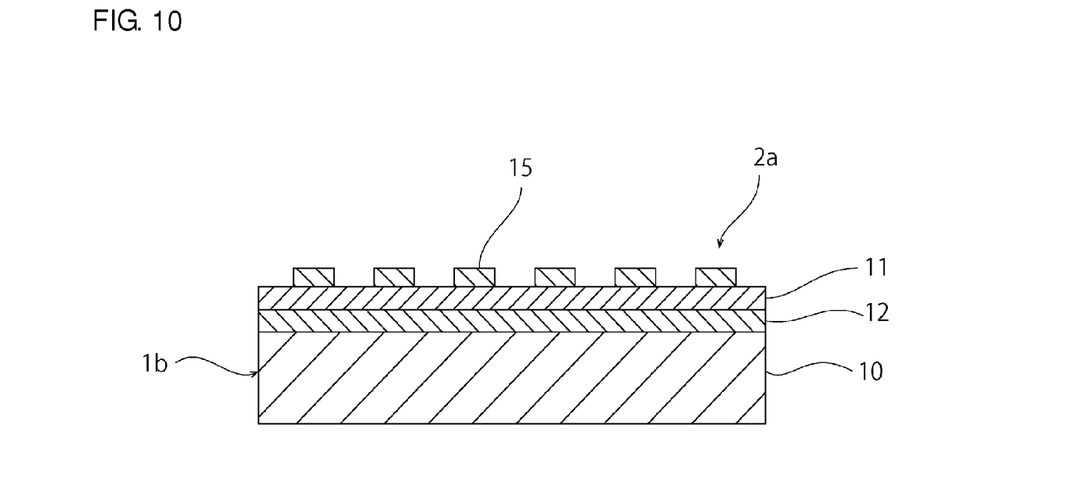
FIG. 10 is a schematic cross-sectional view of an acoustic wave apparatus according to a fifth preferred embodiment of the present invention.

FIG. 10 is a schematic cross-sectional view of an acoustic wave apparatus according to a fifth preferred embodiment of the present invention. An acoustic wave apparatus 2a shown in FIG. 10 includes the piezoelectric member 1b according to the second preferred embodiment of the present invention. In the acoustic wave apparatus 2a, IDT electrodes 15 are disposed on the piezoelectric layer 11 of the piezoelectric member 1b. In the present preferred embodiment, the elastic surface wave propagating on the surface of the piezoelectric layer 11 is excited by the IDT electrodes 15.

Although the material of the IDT electrode 15 is not particularly limited, the IDT electrode 15 preferably includes a portion made of a metal heavier than Al, and it is more preferable that the entire or substantially the entire IDT electrode 15 be made of a metal heavier than Al. Specifically, the IDT electrode 15 is preferably made of at least one of Pt, W, Au, Cu, and Ti, for example. By forming the IDT electrode 15 using a metal heavier than Al, the energy of the excited acoustic wave is concentrated on the surface of the piezoelectric layer 11. Thus, by using the acoustic wave apparatus 2a, an acoustic wave filter device with a high frequency and a wide band is obtained.

As described above, the piezoelectric layer 11 has high piezoelectricity. Thus, an acoustic wave apparatus 2a that is low in cost because the silicon-containing substrate 10 is used, has a high sound speed, and is capable of achieving a high frequency is obtained.

Sixth Preferred Embodiment

Figure 11:
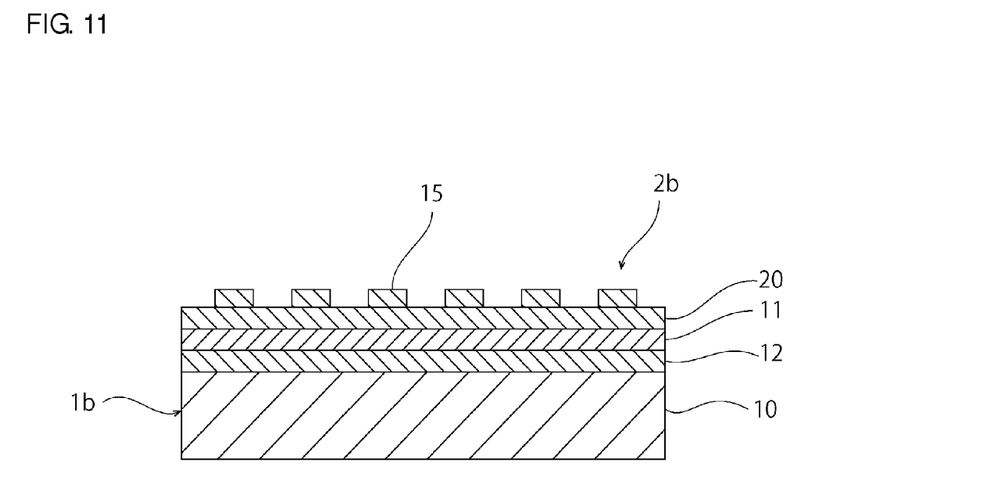
FIG. 11 is a schematic cross-sectional view of an acoustic wave apparatus according to a sixth preferred embodiment of the present invention.

FIG. 11 is a schematic cross-sectional view of an acoustic wave apparatus 2b according to a sixth preferred embodiment of the present invention. As shown in FIG. 11, the acoustic wave apparatus 2b further includes a low sound speed layer 20. The low sound speed layer 20 is disposed on the piezoelectric layer 11. Specifically, the low sound speed layer 20 is disposed between the piezoelectric layer 11 and the IDT electrode 15. The low sound speed layer 20 is lower in sound speed than the piezoelectric layer 11. By providing the low sound speed layer 20, the acoustic wave is appropriately confined in the low sound speed layer 20.

When the low sound speed layer 20 is disposed between the piezoelectric layer 11 and the IDT electrode 15, the low sound speed layer 20 is preferably made of a piezoelectric material.

It is also possible to dispose a dielectric layer made of silicon oxide or the like between the piezoelectric layer 11 and the low sound speed layer 20.

Seventh Preferred Embodiment

Figure 12:
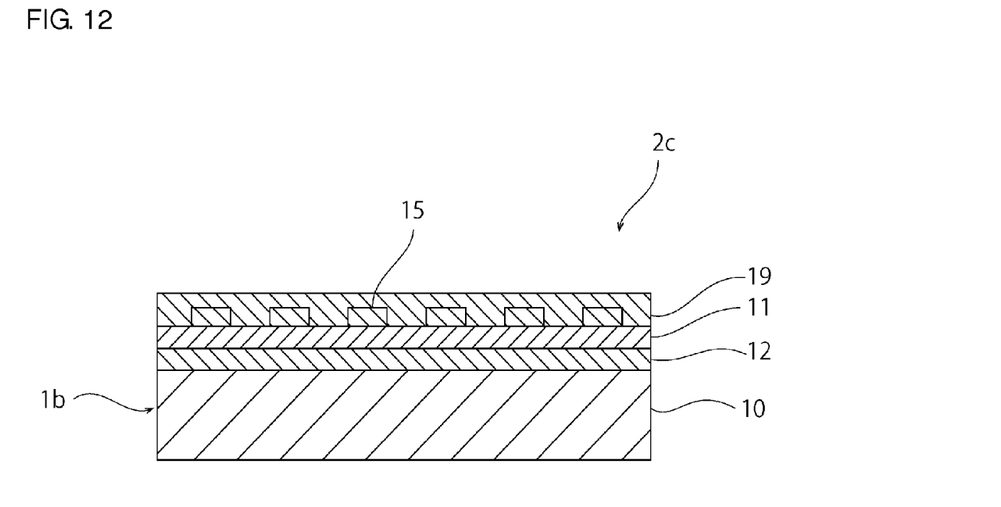
FIG. 12 is a schematic cross-sectional view of an acoustic wave apparatus according to a seventh preferred embodiment of the present invention.

FIG. 12 is a schematic cross-sectional view of an acoustic wave apparatus 2c according to a seventh preferred embodiment of the present invention. As shown in FIG. 12, the acoustic wave apparatus 2c includes a low sound speed layer 19 with a sound speed lower than that of the piezoelectric layer 11. Unlike the low sound speed layer 20 of the second preferred embodiment, the low sound speed layer 19 is provided on the piezoelectric layer 11 so as to cover the IDT electrode 15. Also in this case, since the acoustic wave is appropriately confined in the low sound speed layer 19, an acoustic wave apparatus with a wide band is obtained.

When the low sound speed layer 19 is provided on the IDT electrode 15 like the seventh preferred embodiment of the present invention, the low sound speed layer 19 is preferably made of a dielectric material. Specifically, the low sound speed layer 19 preferably made of silicon oxide, silicon nitride, or silicon oxynitride, for example. The low sound speed layer 19 is preferably made of a material having a frequency-temperature coefficient with a sign opposite to that of the piezoelectric layer 11. For example, when the piezoelectric layer 11 has a negative frequency-temperature coefficient, the low sound speed layer 19 is preferably made of a material having a positive frequency-temperature coefficient.

Eighth Preferred Embodiment

Figure 13:
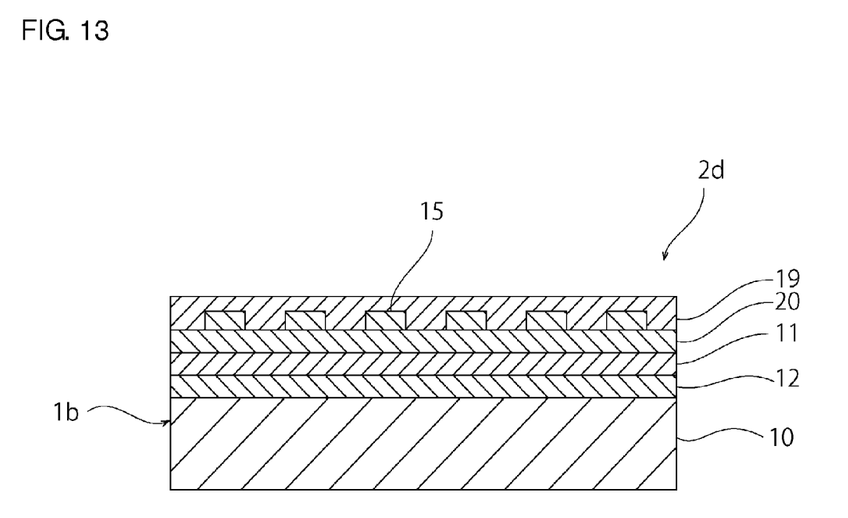
FIG. 13 is a schematic cross-sectional view of an acoustic wave apparatus according to an eighth preferred embodiment of the present invention.

FIG. 13 is a schematic cross-sectional view of an acoustic wave apparatus 2d according to an eighth preferred embodiment of the present invention. As shown in FIG. 13, the acoustic wave apparatus 2d includes both of the low sound speed layer 20 and the low sound speed layer 19. Also in this case, the acoustic wave is appropriately confined in the low sound speed layers 19 and 20.

Ninth Preferred Embodiment

Figure 14:
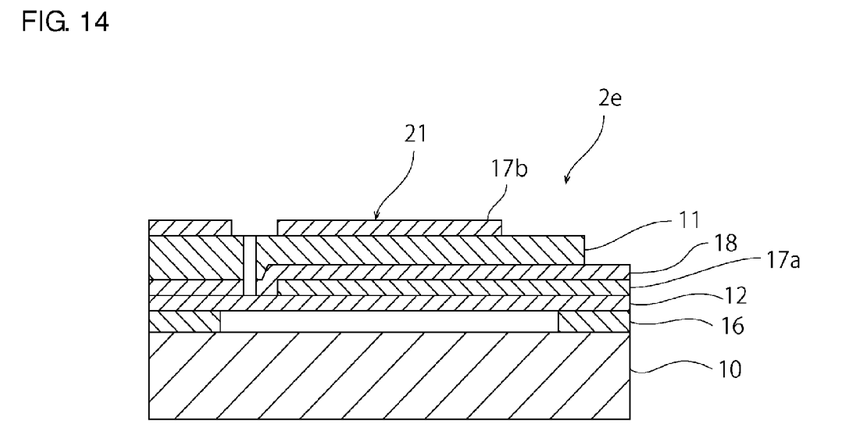
FIG. 14 is a schematic cross-sectional view of an acoustic wave apparatus according to a ninth preferred embodiment of the present invention.

FIG. 14 is a schematic cross-sectional view of an acoustic wave apparatus 2e according to a ninth preferred embodiment of the present invention.

In the fifth to eighth preferred embodiments of the present invention, the acoustic wave apparatuses 2a to 2d, which are elastic surface wave apparatuses, are described. However, the acoustic wave apparatus of the present invention is not limited to elastic surface wave apparatuses. The acoustic wave apparatus according to the present invention may be a bulk acoustic wave apparatus like the acoustic wave apparatus 2e of the present preferred embodiment, for example.

The acoustic wave apparatus 2e includes a stacked body 21 disposed above the silicon-containing substrate 10. The stacked body 21 preferably includes a gap relative to the silicon-containing substrate 10 defined by a support member 16. That is, the stacked body 21 and the silicon-containing substrate 10 are spaced apart from each other.

The stacked body 21 includes the piezoelectric layer 11 and the aluminum nitride layer 12 disposed farther to the silicon-containing substrate 10 side than the piezoelectric layer 11. A portion of the piezoelectric layer 11 preferably includes a gap relative to the silicon-containing substrate 10 sandwiched by a first electrode 17a and a second electrode 17b. By the first and second electrodes 17a and 17b, a voltage is applied to the portion apart from the silicon-containing substrate 10 of the piezoelectric layer 11. Consequently, the bulk acoustic wave is excited. The first and second electrodes 17a and 17b are preferably made of Mo, Ru, Al, Cr, Pt, W, Ti, and/or Au, for example. In the following description of the preferred embodiments of the present invention, an example in which the first and second electrodes 17a and 17b are made of Mo is described.

Also in the present preferred embodiment, the aluminum nitride layer 12 made of aluminum nitride good in self orientation is provided under the piezoelectric layer 11. Therefore, the piezoelectric layer 11 good in piezoelectricity is obtained. In the present preferred embodiment, the first electrode 17a is disposed between the aluminum nitride layer 12 and the piezoelectric layer 11, and the piezoelectric layer 11 is not in direct contact with the aluminum nitride layer 12. Even in such a case, the crystallinity of the first electrode 17a is enhanced by the aluminum nitride layer 12, and also the crystallinity of the piezoelectric layer 11 is enhanced by the first electrode 17a with its crystallinity enhanced. From the viewpoint of further enhancing the crystallinity of the piezoelectric layer 11, it is preferable that another piezoelectric layer 18 be provided between the first electrode 17a and the piezoelectric layer 11. The other piezoelectric layer 18 is desirably made of aluminum nitride, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A piezoelectric member comprising:
a silicon-containing substrate; and a piezoelectric layer disposed on the silicon-containing substrate; wherein at least a surface layer of the piezoelectric layer on a side opposite to the silicon-containing substrate is made of $B_xAl_{1-x}N$, wherein $0<x\leq0.2$, wherein a portion of the piezoelectric layer made of $B_xAl_{1-x}N$ contains a wurtzite-type crystal of $B_xAl_{1-x}N$, and the portion of the piezoelectric layer made of $B_xAl_{1-x}N$ is C-axis oriented so that a (0001) plane is parallel to a surface of the silicon-containing substrate.

2. The piezoelectric member according to claim 1, further comprising an aluminum nitride layer disposed between the silicon-containing substrate and the piezoelectric layer.

3. The piezoelectric member according to claim 2, further comprising a Mo metal layer disposed between the aluminum nitride layer and the piezoelectric layer.

4. The piezoelectric member according to claim 3, further comprising another aluminum nitride layer disposed between the Mo metal layer and the piezoelectric layer.

5. The piezoelectric member according to claim 2, wherein the aluminum nitride layer contains a wurtzite-type crystal of aluminum nitride.

6. The piezoelectric member according to claim 2, wherein a thickness of the Mo metal layer is about 10 nm to about 500 nm.

7. The piezoelectric member according to claim 2, wherein the thickness of the aluminum nitride layer is about 10 nm or more.

8. The piezoelectric member according to claim 1, wherein a thickness of the piezoelectric layer is about 50 nm to about 5000 nm.

9. The piezoelectric member according to claim 1, further comprising a low sound speed layer disposed on the piezoelectric layer having a sound speed lower than that of the piezoelectric layer.

10. An acoustic wave apparatus comprising the piezoelectric member according to claim 1.

11. The acoustic wave apparatus according to claim 10, wherein the acoustic wave apparatus is one of an acoustic wave apparatus and a bulk acoustic wave apparatus.

12. The piezoelectric member according to claim 1, wherein the piezoelectric layer is formed by a sputtering method.

13. The piezoelectric member according to claim 1, further comprising an aluminum nitride layer disposed between the silicon-containing substrate and the piezoelectric layer.

14. The piezoelectric member according to claim 13, wherein the thickness of the aluminum nitride layer is about 10 nm or more.

15. The piezoelectric member according to claim 1, further comprising an aluminum nitride layer disposed between the silicon-containing substrate and the piezoelectric layer.

16. The piezoelectric member according to claim 1, wherein $0.03\leq x\leq0.18$.

* * * * *